United States Patent
Kanda et al.

(10) Patent No.: US 7,288,816 B2
(45) Date of Patent: Oct. 30, 2007

(54) SEMICONDUCTOR DEVICE

(75) Inventors: Ryo Kanda, Gunma (JP); Shuichi Kikuchi, Gunma (JP); Seiji Otake, Saitama (JP); Hirotsugu Hata, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 59 days.

(21) Appl. No.: 11/360,287

(22) Filed: Feb. 22, 2006

(65) Prior Publication Data

US 2007/0063274 A1  Mar. 22, 2007

(30) Foreign Application Priority Data

Feb. 24, 2005  (JP)  ............................. P2005-049005

(51) Int. Cl.
*H01L 29/78* (2006.01)
(52) U.S. Cl. ....................... 257/343; 257/355; 257/335; 257/557
(58) Field of Classification Search ......... 257/335.343, 257/557, 355, 110, 490, 494, 495, 487; 438/237, 438/510, 519, 521, 560
See application file for complete search history.

(56) References Cited

U.S. PATENT DOCUMENTS

| 6,288,424 B1 * | 9/2001 | Ludikhuize ................. 257/335 |
| 6,909,143 B2 * | 6/2005 | Jeon et al. ................... 257/335 |
| 2003/0127689 A1 * | 7/2003 | Hebert ........................ 257/336 |

FOREIGN PATENT DOCUMENTS

JP   10-506503   6/1998

* cited by examiner

*Primary Examiner*—Zandra V. Smith
*Assistant Examiner*—Paul E Patton
(74) *Attorney, Agent, or Firm*—Fish & Richardson P.C.

(57) ABSTRACT

According to a semiconductor device of an embodiment of the present invention, a P-type buried diffusion layer is formed across a substrate and an epitaxial layer. An N-type buried diffusion layer is formed in the P-type buried diffusion layer. An overvoltage protective PN junction region is formed below an element formation region. A breakdown voltage of the PN junction region is lower than a source-drain breakdown voltage. This structure prevents a breakdown current from concentratedly flowing into the PN junction region and protects the semiconductor device from overvoltage.

6 Claims, 7 Drawing Sheets

SEMICONDUCTOR DEVICE

BACKGROUND OF THE INVENTION

Priority is claimed to Japanese Patent Application Number JP2005-049005 filed on Feb. 24, 2005, the disclosure of which is incorporated herein by reference in its entirety.

1. Field of the Invention

The present invention relates to a semiconductor device capable of protecting a semiconductor element from an overvoltage.

2. Description of the Related Art

In conventional semiconductor devices, for example, an N-type epitaxial layer is deposited on a P-type semiconductor substrate for producing an N-channel type LDMOS transistor. In the epitaxial layer, a P-type diffusion region is formed as a back-gate region. In the P-type diffusion region, an N-type diffusion region is formed as a source region. In the epitaxial layer, another N-type diffusion region is formed as a drain region. In addition, an N-type buried region extending over the semiconductor substrate and the epitaxial layer is formed below the drain region. This structure is designed such that a breakdown voltage in a PN junction region formed by the buried region and the semiconductor substrate is lower than a source-drain breakdown voltage of the LDMOS transistor. According to this structure, even in the case of applying an overvoltage that would break the LDMOS transistor to a drain electrode, the PN junction region formed by the buried region and the semiconductor substrate is broken down. As a result, the LDMOS transistor can be prevented from being broken due to the overvoltage. This technology is described for instance in Published Japanese Patent Translations of PCT International Publications for Patent Applications No. 10-506503 (page 4 to 5, and 7, FIGS. 1 and 2).

As mentioned above, in the conventional semiconductor device, the N-type buried region is formed below the drain region for preventing the LDMOS transistor from being broken due to the overvoltage applied to the drain region. The N-type buried region is formed so as to have a substantially equal to that of the drain region. According to this structure, when overvoltage is applied to the drain region to cause a breakdown of the PN junction region between the N-type buried region and the P-type semiconductor substrate, a breakdown current concentrates on the PN junction region. Therefore, there has been a problem that the PN junction region would be broken due to current a concentration and a heat generation resulting from the current concentration.

Further, in the conventional semiconductor device, in order to prevent the current concentration on the PN junction region, it is possible to counter this problem by forming the N-type buried region over a wider region. The conventional semiconductor device aims at improving a withstand voltage characteristic by use of a known RESURF principle. For this reason, the N-type buried region extends largely toward an isolation regionside. Meanwhile, a structure is adopted, in which the N-type buried region is additionally to the LDMOS transistor in order to form the PN junction region. That is, when the N-type buried region is formed over a wider region, a distance between the drain region and the isolation region increases, and an inactive region where no element is formed is widened. For this reason, there has been a problem that an element formation region cannot be efficiently arranged in terms of a chip size.

SUMMARY OF THE INVENTION

The present invention has been accomplished in view of the above circumstances. A semiconductor device according to an aspect of the present invention includes: a semiconductor substrate; a plurality of epitaxial layers deposited on the semiconductor substrate and used as a semiconductor element formation region; a buried diffusion layer of one conductivity type formed below the semiconductor element formation region; and a buried diffusion layer of an opposite conductivity type formed below the semiconductor element formation region and led out on the buried diffusion layer of the one conductivity type, wherein a breakdown voltage of a first junction region between the buried diffusion layer of the one conductivity type and the buried diffusion layer of the opposite conductivity type is lower than a breakdown voltage of a second junction region formed on a current path of a semiconductor element. Therefore, according to the semiconductor device of the present invention, when an overvoltage is applied to a semiconductor element, the first junction region is first broken down ahead of the second junction region. This structure prevents the semiconductor element from being broken due to the applied overvoltage.

Further, in the semiconductor device according to the present invention, the buried diffusion layer of the opposite conductivity type is formed by coupling a first buried diffusion layer of an opposite conductivity type formed to overlap with the buried diffusion layer of the one conductivity type with a second buried diffusion layer of an opposite conductivity type formed above the buried diffusion layer of the one conductivity type. Therefore, according to the semiconductor device of the present invention, the first junction region is formed by the buried diffusion layer of the one conductivity type and the first buried diffusion layer of the opposite conductivity type. This structure facilitates an adjustment of a breakdown voltage of the first junction region to a desired value.

Further, in the semiconductor device according to the present invention, the semiconductor element is any one of an NPN transistor, a PNP transistor, an N-channel MOS transistor, and a P-channel MOS transistor. Therefore, according to the semiconductor device of the present invention, an overvoltage protection structure for any semiconductor element formed in the semiconductor element formation region can be realized.

A semiconductor device according to another aspect of the present invention includes: a semiconductor substrate of one conductivity type; a first epitaxial layer of an opposite conductivity type formed on the semiconductor substrate; a buried diffusion layer of one conductivity type formed across the semiconductor substrate and the first epitaxial layer; a first buried diffusion layer of an opposite conductivity type formed across the semiconductor substrate and the first epitaxial layer, the first buried diffusion layer being formed to overlap with the buried diffusion layer of the one conductivity type a first junction region between the buried diffusion layer of the one conductivity type and the first buried diffusion layer of the opposite conductivity type; a second epitaxial layer of an opposite conductivity type formed on the first epitaxial layer; a second buried diffusion layer of an opposite conductivity type formed across the first epitaxial layer and the second epitaxial layer so as to be continuous with the first buried diffusion layer of the opposite conductivity type; and a semiconductor element formed above the second buried diffusion layer of the opposite conductivity type, wherein a breakdown voltage of the first junction region is lower than a breakdown voltage of a second junction region formed on a current path of the semiconductor element. Therefore, according to the semiconductor device of the present invention, the buried diffusion layer of the one conductivity type and the first buried diffusion layer of the opposite conductivity type are formed across the semiconductor substrate and the first epitaxial layer to form the first junction region. The second buried diffusion layer of the opposite conductivity type is formed across the first and second epitaxial layers such that the first and second buried diffusion layers of the opposite conductivity type become continuous with each other. With this structure, an overvoltage protection structure is realized.

DESCRIPTION OF THE PREFERRED EMBODIMENTS

Figure 1:
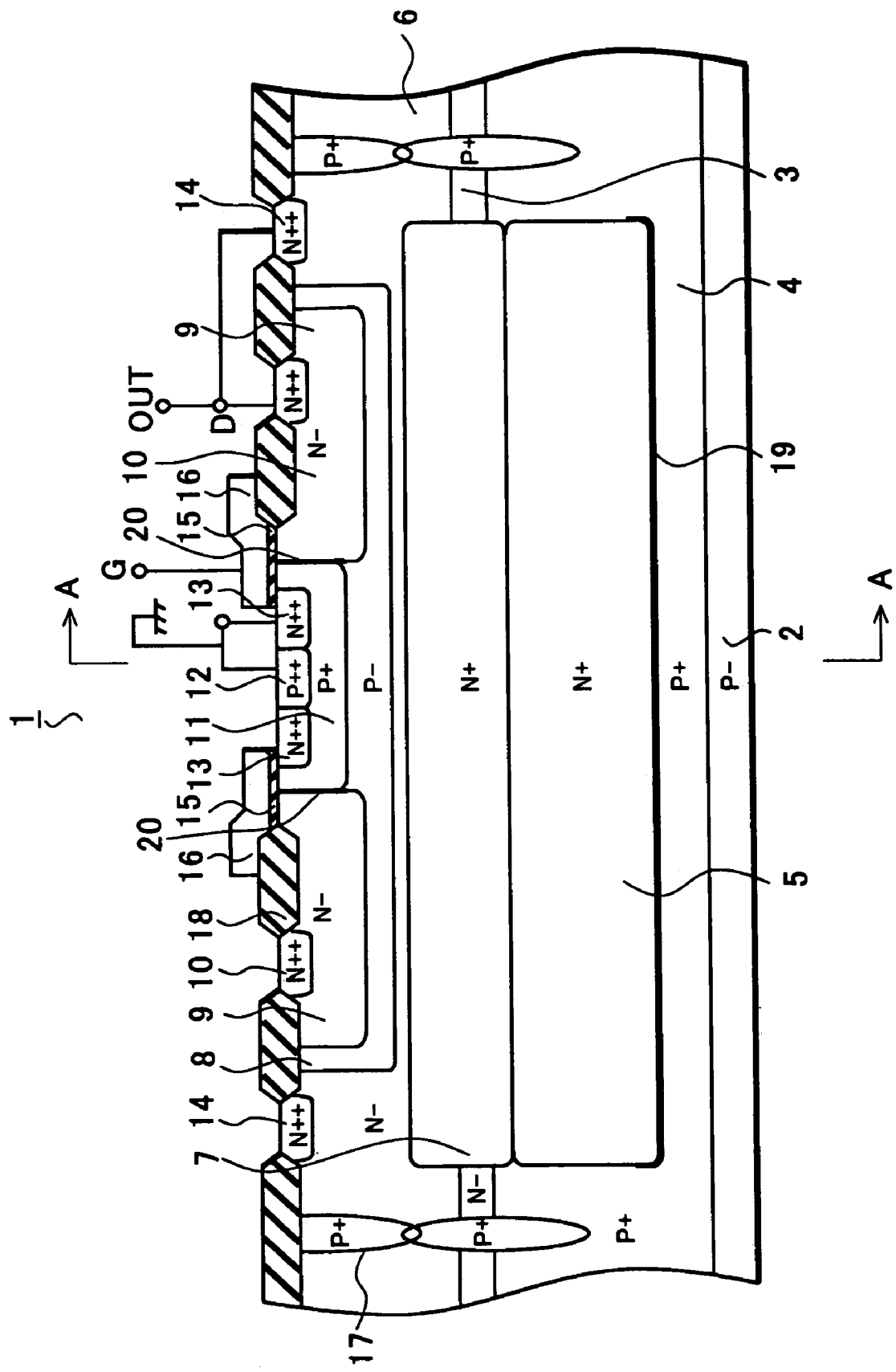
FIG. 1 is a sectional view illustrating a semiconductor device according to an embodiment of the present invention.
Figure 2:
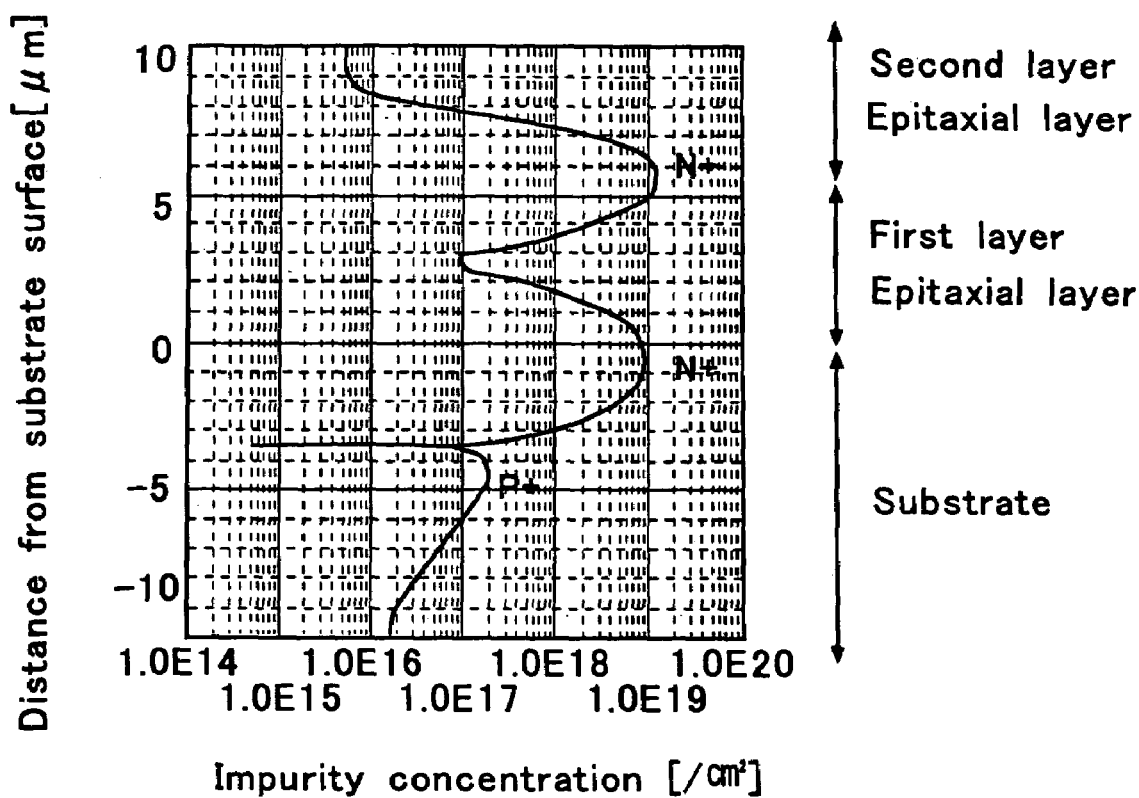
FIG. 2 illustrates a concentration profile of a region constituting an overvoltage protection structure according to the embodiment of the present invention.
Figure 3:
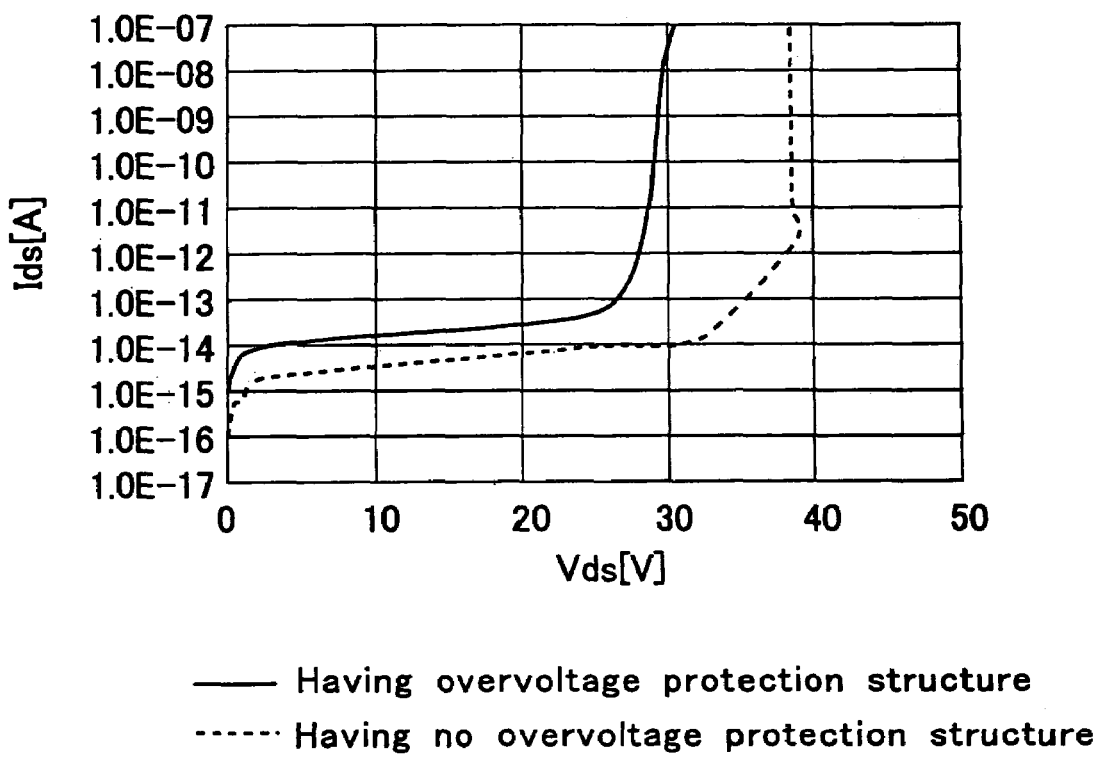
FIG. 3 illustrates a relation between a source-drain current value and a source-drain voltage value of the semiconductor device according to the embodiment of the present invention.
Figure 4:
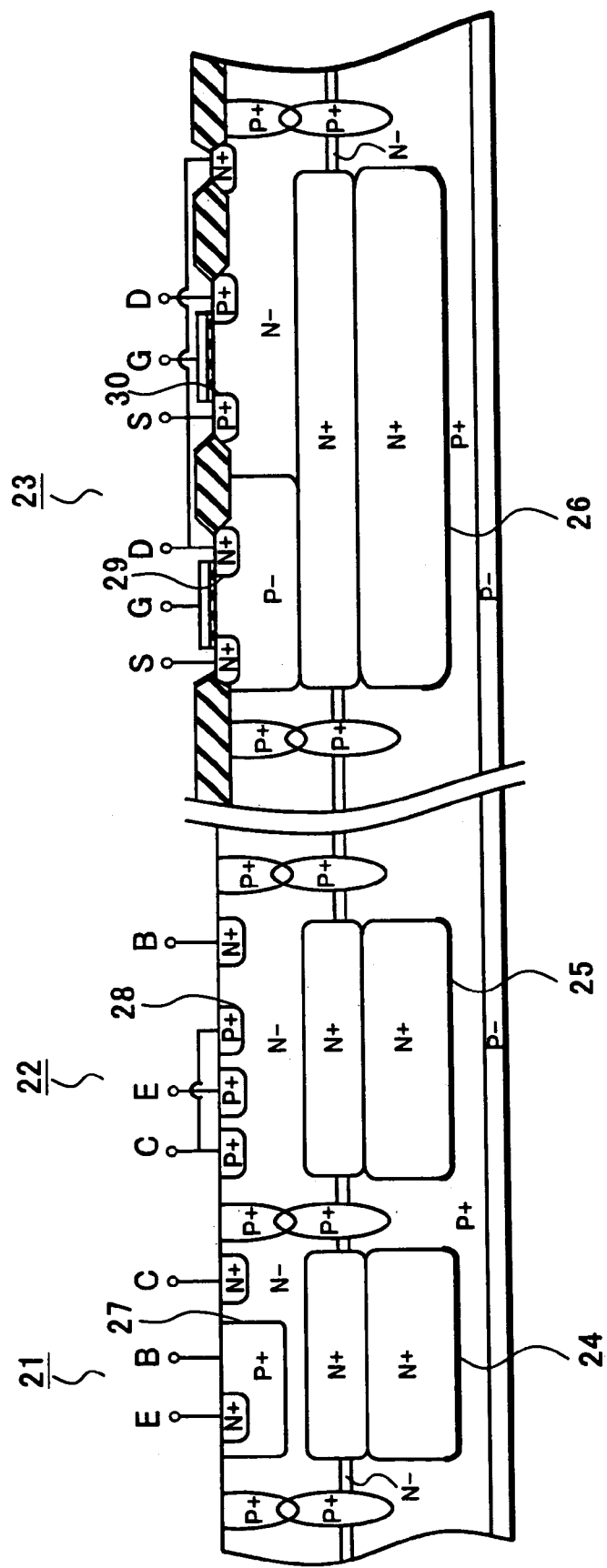
FIG. 4 is a sectional view illustrating the semiconductor device according to the embodiment of the present invention.

Hereinafter, a semiconductor device according to an embodiment of the present invention will be described in detail with reference to FIGS. 1 to 4. FIG. 1 is a sectional view illustrating the semiconductor device according to the embodiment of the present invention. FIG. 2 illustrates a concentration profile of a region serving as a PN junction region constituting an overvoltage protection structure. FIG. 3 is a comparison diagram showing a result of comparing element characteristics of a semiconductor device having an overvoltage protection structure with those of a semiconductor device having no overvoltage protection structure. FIG. 4 is a sectional view illustrating the semiconductor device according to the embodiment of the present invention.

As shown in FIG. 1, an N-channel type LDMOS transistor 1 is mainly composed of a P-type single crystal silicon substrate 2, a first N-type epitaxial layer 3, a P-type buried diffusion layer 4, an N-type buried diffusion layer 5, a second N-type epitaxial layer 6, an N-type buried diffusion layer 7, a P-type diffusion layer 8, N-type diffusion layers 9 and 10 used as drain regions, P-type diffusion layers 11 and 12 as a back-gate region, an N-type diffusion layer 13 as a source region, an N-type diffusion layer 14, a gate oxide film 15, and a gate electrode 16.

The first-layer N-type epitaxial layer 3 is deposited on an upper surface of the P-type single crystal silicon substrate 2.

The P-type buried diffusion layer 4 is formed on both regions of the substrate 2 and the epitaxial layer 3. The P-type buried diffusion layer 4 is formed by diffusing boron (B), for instance. In FIG. 1, the P-type buried diffusion layer 4 is formed throughout the substrate 2. However, the layer 4 only needs to be formed in a region serving as a PN junction region between this region and the N-type buried diffusion layer 5. Further, the P-type buried diffusion layer 4 of this embodiment corresponds to "a buried diffusion layer of one conductivity type" of the present invention.

The N-type buried diffusion layer 5 is formed on both regions of the substrate 2 and the epitaxial layer 3. The N-type buried diffusion layer 5 is formed by diffusing antimony (Sb), for instance. As shown in FIG. 1, the N-type buried diffusion layer 5 is formed across a region for forming the LDMOS transistor 1 between isolation regions 17. In addition, the P-type buried diffusion layer 4 is extended above the N-type buried diffusion layer 5 due to a difference in an impurity diffusion coefficient. Incidentally, the N-type buried diffusion layer 5 of this embodiment corresponds to "a first buried diffusion layer of an opposite conductivity type".

The second-layer N-type epitaxial layer 6 is formed on an upper surface of the first-layer N-type epitaxial layer 3.

The N-type buried layer 7 is formed on both regions of the first-layer epitaxial layer 3 and the second-layer epitaxial layer 6. The N-type buried diffusion layer 7 is formed by diffusing antimony (Sb), for instance. As shown in FIG. 1, the N-type buried diffusion layer 7 is formed by diffusing impurities from above the P-type buried diffusion layer 4 so as to be continuous with the N-type buried diffusion layer 5. Incidentally, the N-type buried diffusion layer 7 of this embodiment corresponds to "a second buried diffusion layer of an opposite conductivity type" of the present invention. Further, the N-type buried diffusion layers 5 and 7 correspond to "buried diffusion layers of the opposite conductivity type" of this embodiment.

The P-type diffusion layer 8 is formed in the epitaxial layer 6. In the P-type diffusion layer 8, a source region, a drain region, and a back-gate region of the LDMOS transistor 1 are formed.

The N-type diffusion layers 9 and 10 are formed in the P-type diffusion layer 8. The N-type diffusion layers 9 and 10 are used as drain regions, and constitute a double-diffused structure. The N-type diffusion layers 9 and 10 are formed in a ring shape about the P-type diffusion layer 11.

The P-type diffusion layers 11 and 12 are formed in the P-type diffusion layer 8. The P-type diffusion layer 11 is used as a back-gate region and the P-type diffusion layer 12 is used as a back-gate lead-out region.

The N-type diffusion layer 13 is formed in the P-type diffusion layer 11. The N-type diffusion layer 13 is used as a source region. The N-type diffusion layer 13 is formed in a ring shape about the P-type diffusion layer 12. The P-type diffusion layer 11 between the N-type diffusion layers 9 and 13 is used as a channel region. Then, the P-type diffusion layer 12 and the N-type diffusion layer 13 are connected with a source electrode. That is, the P-type diffusion layer 12 is applied with a back-gate potential the level of which is equal to a source potential. Incidentally, the source potential and the back-gate potential are both ground potential in this embodiment.

The N-type diffusion layer 14 is formed in the epitaxial layer 6 between the P-type diffusion layer 8 and the P-type isolation region 17. The N-type diffusion layer 14 is connected with an output pad connected with the N-type diffusion layer 10 through a wiring above the epitaxial layer 6. Based on this structure, the N-type diffusion layer 14 is applied with a drain potential. In addition, as shown in FIG. 1, the N-type buried diffusion layers 5 and 7 are formed below the N-type diffusion layer 14 through the N-type epitaxial layers 3 and 6. The N-type buried diffusion layers 5 and 7 are applied with the drain potential through the N-type diffusion layer 14.

The gate oxide film 15 is formed on a surface of the epitaxial layer 6 where the back-gate region or the like is formed.

The gate electrode 16 is formed on the gate oxide film 15. The gate electrode 16 is formed of, for example, polysilicon or tungsten silicon so as to have a desired film thickness.

Finally, a LOCOS (local oxidation of silicon) oxide film 18 is formed in a desired portion of the epitaxial layer 6. Although not shown, an insulating layer such as a BPSG (boron phospho silicate glass) film or an SOG (spin on glass) film is formed on the upper surface of the epitaxial layer 6.

Next, as indicated by the heavy solid line of FIG. 1, a PN junction region 19 between the P-type buried diffusion layer 4 and the N-type buried diffusion layer 5 is formed below a region where the LDMOS transistor 1 is formed. As mentioned above, the N-type buried diffusion layer 5 is applied with the drain potential. Meanwhile, although not shown, the P-type isolation regions 17 are grounded, and thus the P-type buried diffusion layer 4 is grounded through the isolation region 17. That is, the PN junction region 19 is applied with a reverse bias voltage. During a normal operation of the LDMOS transistor 1, the PN junction region 19 is in an open state. Incidentally, the PN junction region 19 of this embodiment corresponds to "a first junction region" of the present invention.

Further, as indicated by the heavy solid line of FIG. 1, a PN junction region 20 between the N-type diffusion layer 9 and the P-type diffusion layer 11 is formed on a current path of the LDMOS transistor 1. The N-type diffusion layer 9 is applied with the drain potential through the N-type diffusion layer 10. On the other hand, the P-type diffusion layer 11 is applied with the back-gate potential through the P-type diffusion layer 12. That is, as in the case of the PN junction region 19, the PN junction region 20 is applied with the reverse bias voltage. Incidentally, the PN junction region 20 of this embodiment corresponds to "a second junction region" of the present invention. Further, the "second junction region" may be a junction region between the N-type epitaxial layer 6 and the P-type diffusion layer 11 if neither the P-type diffusion layer 8 nor the N-type diffusion layer 9 is formed.

According to this structure, the PN junction regions 19 and 20 are applied with the reverse biases which are substantially equal to each other. An overvoltage generated at the time of turning off an L load such as a motor load is applied between a source and a drain of the LDMOS transistor 1 through the drain region. In this case, the PN junction region 19 is broken down before the breakdown of the PN junction region 20, making it possible to prevent the LDMOS transistor 1 from being broken. Although a detailed description is given later, in this embodiment, an impurity concentration for each of the P-type buried diffusion layer 4 and the N-type buried diffusion layer 5 is set such that a breakdown voltage of the PN junction region 19 becomes lower than a breakdown voltage (source-drain breakdown voltage) of the PN junction region 20. That is, a formation range of a depletion layer is reduced by forming the high-impurity-concentration P-type buried diffusion layer 4 at the bottom of the N-type buried diffusion layer 5 and its surroundings. Incidentally, the PN junction region 19 may be formed on side portions of the N-type buried diffusion layer 5 by adjusting the impurity concentration of the P-type buried diffusion layer 4.

FIG. 2 shows a concentration profile of the P-type buried diffusion layer 4 and the N-type buried diffusion layers 5 and 7 that constitutes the PN junction region 19 as viewed in an A-A section of the LDMOS transistor 1 of FIG. 1. In FIG. 2, the horizontal axis represents an impurity concentration, and the vertical axis represents a distance from the substrate surface. A distance from the substrate surface toward the epitaxial layer surface is represented by a positive value, and a distance from the substrate surface toward the substrate bottom is represented by a negative value.

As shown in FIG. 2, in the P-type buried diffusion layer 4, an impurity concentration peak appears at the distance of about $-4$ ($\mu$m) from the substrate 2 surface. In the N-type buried diffusion layer 5, an impurity concentration peak appears at a boundary between the substrate 2 and the epitaxial layer 3. In the N-type buried diffusion layer 7, an impurity concentration peak appears at the distance of 6 ($\mu$m) from the substrate 2 surface. The PN junction region 19 is formed at the distance of about $-3$ to $-4$ ($\mu$m) from the substrate 2 surface. The P-type buried diffusion layer 4 around the PN junction region 19 has an impurity concentration of about $10 \times 10^{16}$ to $1.0 \times 10^{17}$ (/cm$^2$). That is, the P-type buried diffusion layer 4 is formed to have a high impurity concentration in the vicinity of the PN junction region 19. Such a concentration profile is obtained by layering a high-impurity-concentration N-type buried diffusion layer 5 on the P-type buried diffusion layer 4.

Meanwhile, as shown in FIG. 1, in this embodiment, the P-type buried diffusion layer 4 has a high impurity concentration. In addition, the P-type buried diffusion layer 4 is bulged from the N-type buried diffusion layer 5 due to a difference of the impurity concentrations therebetween. Thus, the N-type buried diffusion layer 7 is formed on an upper surface of the N-type buried diffusion layer 5, so the diffusion layers 5 and 7 are continuous with each other.

With this structure, the N-type buried diffusion layer 7 is led out with respect to the P-type buried diffusion layer 4. Thus, a reverse bias can be applied to the PN junction region 19. Then, an impurity concentration of the P-type buried diffusion layer 4 around the PN junction region 19 is formed so as to have a high impurity concentration, and the breakdown voltage of the PN junction region 19 can be made to be lower than that of the PN junction region 20.

FIG. 3 shows an example where a voltage BVds of the LDMOS transistor 1 is set to 40 (V). In FIG. 3, the solid line corresponds to the case of having the overvoltage protection structure (PN junction region 19), and the dotted line corresponds to the case of having no overvoltage protection structure (PN junction region 19). Since the structure shown by the solid line is designed such that the PN junction region 19 has a breakdown voltage of about 30 (V), a voltage not less than about 30 (V) is never applied between the source and the drain. On the other hand, in the structure shown by the dotted line, a voltage of about 38 (V) is applied between the source and the drain, and the PN junction region 20 breaks down. As mentioned above, the provision of the PN junction region 19 as the overvoltage protection structure makes it possible to realize a structure that the LDMOS transistor 1 is hardly broken even if applied with an overvoltage.

Incidentally, the breakdown voltage of the PN junction region 19 can be arbitrarily set and changed by adjusting impurity concentrations of the P-type buried diffusion layer 4 and the N-type buried diffusion layer 5, and by adjusting diffusion widths of the P-type buried diffusion layer 4 and the N-type buried diffusion layer 5. If the breakdown voltage of the PN junction region 19 is set too low, a current carrying capacity of the LDMOS transistor may deteriorate. Therefore, the breakdown voltage of the PN junction region 19 can be set within a desired range in consideration of element characteristics.

Further, as shown in FIG. 1, in this embodiment, the P-type buried diffusion layer 4 and the N-type buried diffusion layer 5 are formed across a wide range below the LDMOS transistor 1. It is possible to form the PN junction region 19 in a wide range below the LDMOS transistor 1. According to this structure, it is possible to efficiently arrange the N-type buried diffusion layer 5, and an increase in an inactive region having no element in an actual operation region is prevented. Thus, it is possible to reduce a chip size. Further, the PN junction region 19 breaks down, and a generated breakdown current flows to the substrate 2. At this time, the PN junction region 19 is formed across a wide region, making it possible to prevent a breakdown current concentration and a heat generation due to the breakdown current concentration. Thus, it is possible to prevent the PN junction region 19 from being broken.

As shown in FIG. 4, in this embodiment, even in the case of forming an NPN transistor 21, a PNP transistor 22 and a CMOS transistor 23 in an element formation region, PN junction regions 24, 25, and 26 can constitute the overvoltage protection structure. Incidentally, the structures and beneficial effects of the PN junction regions 24, 25 and 26 are the same as those of the PN junction region 19 as shown in FIG. 1. Thus, a detailed description thereof is omitted here.

In the NPN transistor 21, when the overvoltage is applied to a collector electrode, for example, the PN junction region 24 is broken down ahead of a PN junction region 27 on the current path. Thus, it is possible to prevent the NPN transistor 21 from being broken.

In the PNP transistor 22, when the overvoltage is applied to a base electrode, for example, the PN junction region 25 is broken down ahead of a PN junction region 28 on the current path. Thus, it is possible to prevent the PNP transistor 22 from be broken.

In the CMOS transistor 23, when an overvoltage is applied to a drain electrode of an N-channel type transistor or a source electrode of a P-channel type transistor, for example, the PN junction region 26 is broken down ahead of PN junction regions 29 and 30 on the current path. Thus, it is possible to prevent the CMOS transistor 23 from being broken.

In this embodiment, the overvoltage protection structure can be used irrespective of whether the NPN transistor 21, the PNP transistor 22, the CMOS transistor 23 and the like are used as discrete elements or a semiconductor integrated circuit.

This embodiment describes the case where the two epitaxial layers are layered on the substrate to form the overvoltage protection structure and semiconductor elements. However, the embodiment of the present invention is not limited thereto. For example, the embodiment of the present invention is applicable to both of the case of forming one epitaxial layer on the substrate and the case of forming plural epitaxial layers on the substrate. That is, the PN junction region broken down ahead of the PN junction region formed on the current path of the semiconductor element is formed below the semiconductor element, whereby similar beneficial effects can be attained. Furthermore, the embodiment of the present invention allows various modifications within a scope of the invention.

Next, a manufacturing method for a semiconductor device according to another embodiment of the present invention is described in detail with reference to FIGS. 5 to 10. In the following description, the same components as those of the semiconductor device of FIG. 1 are denoted by like reference numerals.

FIGS. 5 to 10 are sectional views illustrating a manufacturing method for a semiconductor device according to this embodiment. The following description is focused on an example where an N-channel type MOS transistor is formed in one element formation region defined by isolation regions. However, the present invention is not limited to this example. For example, a P-channel type MOS transistor, an NPN type transistor, and a vertical PNP transistor may be formed in another element formation region to constitute a semiconductor integrated circuit device.

Figure 5:
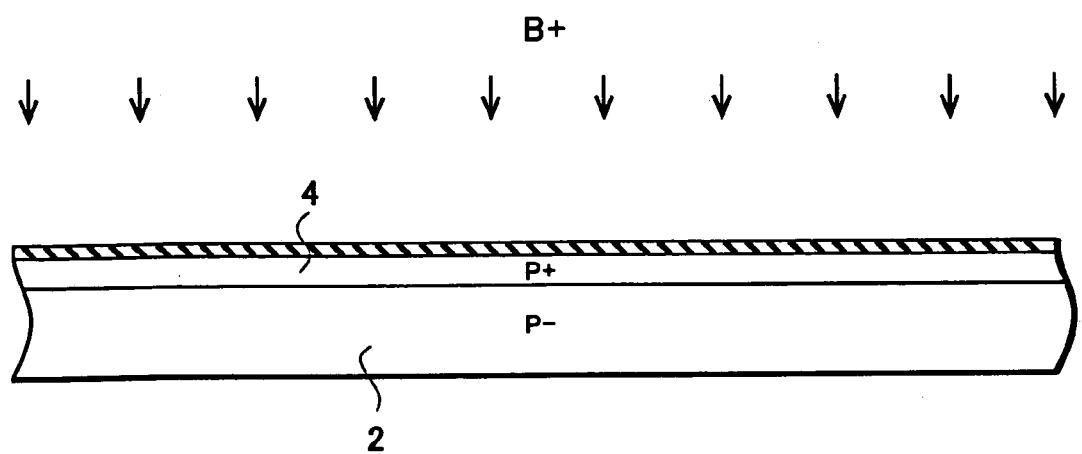
FIG. 5 is a sectional view illustrating a manufacturing method for the semiconductor device according to the embodiment of the present invention.

First of all as shown in FIG. 5, a P-type single crystal silicon substrate 2 is prepared. A P-type impurities for instance, boron (B) is injected from a surface of the substrate 2 through ion implantation into a region for forming a P-type buried diffusion layer 4 by using a known photolithographic technique. After removing a photoresist, the impurity injected through ion implantation is diffused.

Figure 6:
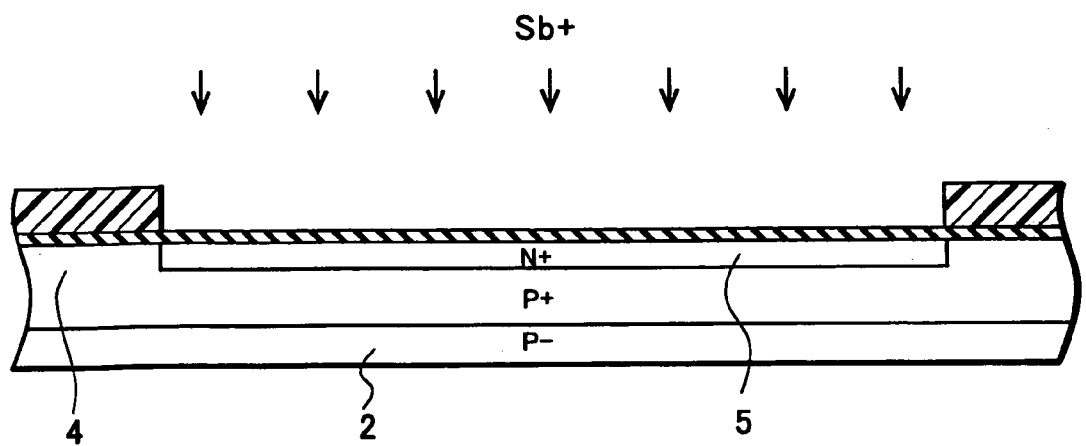
FIG. 6 is a sectional view illustrating the manufacturing method for the semiconductor device according to the embodiment of the present invention.

Next, as shown in FIG. 6, an N-type impurity, for example, antimony (Sb) is injected from the surface of the substrate 2 through ion implantation into a region for forming a N-type buried diffusion layer 5 by using the known photolithographic technique. After removing a photoresist, the impurity injected through the ion implantation is diffused.

Figure 7:
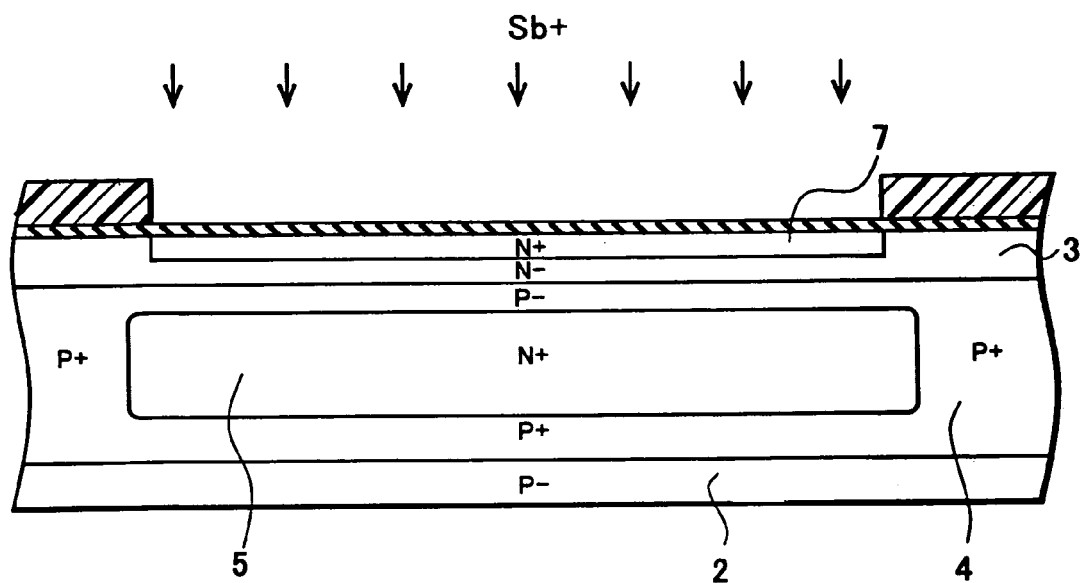
FIG. 7 is a sectional view illustrating the manufacturing method for the semiconductor device according to the embodiment of the present invention.

As shown in FIG. 7, the substrate 2 is next arranged on a susceptor of an epitaxial growth apparatus. Then, the substrate 2 is heated up to about 1200° C., for example, with a lamp, and at the same time, an $SiHCl_3$ gas and an $H_2$ gas are introduced into a reactive tube. Through this step, an epitaxial layer 3 with a specific resistance of 0.1 to 2.0 Ω·cm and a thickness of about 0.5 to 1.5 μm is formed on the substrate 2, for example. Through this step, the impurity injected into the P-type buried diffusion layer 4 and the N-type buried diffusion layer 5 is diffused into the epitaxial layer 3. At this time, since boron (B) has a diffusion coefficient larger than that of antimony (Sb), the P-type buried diffusion layer 4 is extended above the N-type buried diffusion layer 5.

After that, an N-type impurity, for example, antimony (Sb) is injected from a surface of the epitaxial layer 3 through ion implantation into a region for forming an N-type buried diffusion layer 7 by using the known photolithographic technique. After removing a photoresist, the impurity injected through the ion implantation is diffused.

Figure 8:
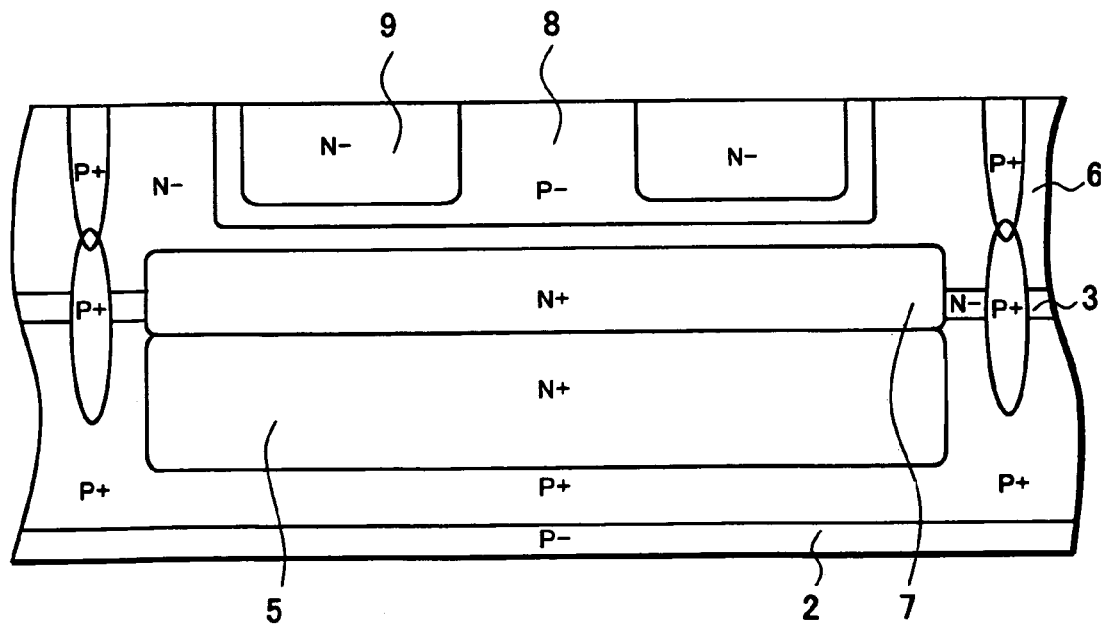
FIG. 8 is a sectional view illustrating the manufacturing method for the semiconductor device according to the embodiment of the present invention.

Next, as shown in FIG. 8, the substrate 2 is placed again on the susceptor of the epitaxial growth apparatus. Then, the substrate 2 is heated up to about 1200° C., for example, with a lamp, and at the same time, an $SiHCl_3$ gas and an $H_2$ gas are introduced into a reactive tube. Through this step, an epitaxial layer 6 with a specific resistance of 0.1 to 2.0 Ω·cm and a thickness of about 0.5 to 1.5 μm, for example, is grown on the epitaxial 3. Through this step, the impurity injected into the N-type buried diffusion layer 7 is diffused into the epitaxial layers 3 and 6. As a result, the N-type buried diffusion layers 5 and 7 become continuous with each other.

After that, a P-type diffusion region 8 and an N-type diffusion region 9 are sequentially formed from a surface of the epitaxial layer 6 by use of the known photolithographic technique.

Figure 9:
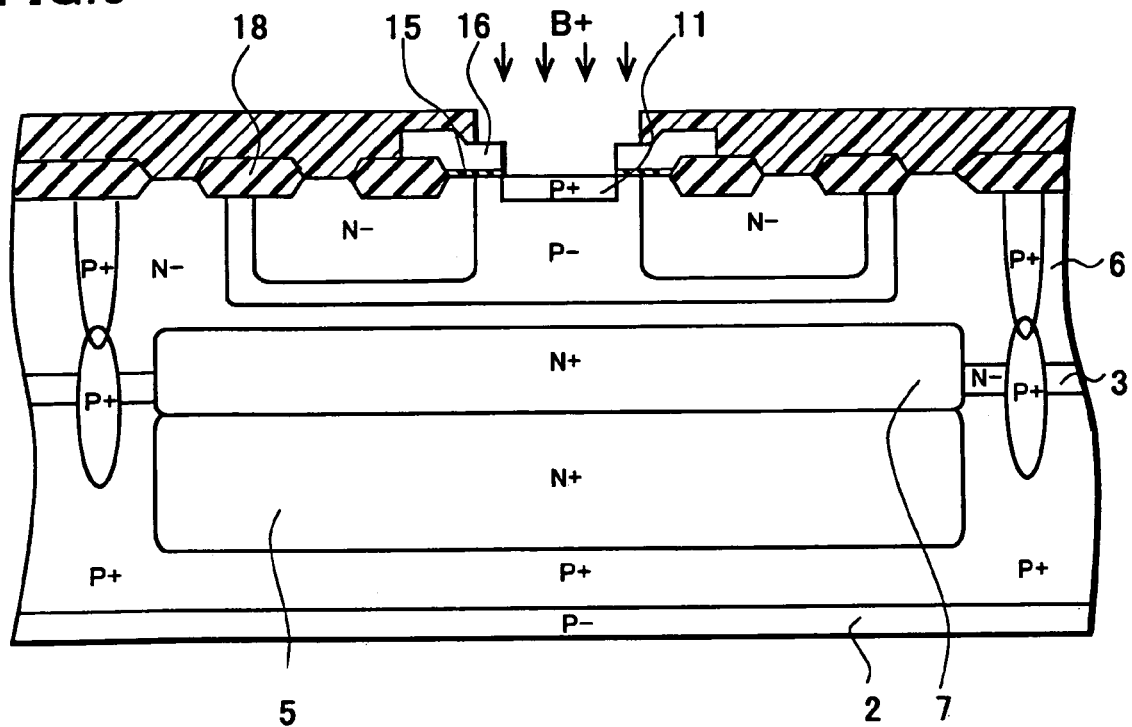
FIG. 9 is a sectional view illustrating the manufacturing method for the semiconductor device according to the embodiment of the present invention.

Next, as shown in FIG. 9, the entire substrate 2 is subjected to a heat treatment to form an LOCOS oxide film 18 in a desired portion of the epitaxial layer 6. Then, a silicon oxide film, a polysilicon film, and a tungsten silicon film are deposited on the epitaxial layer 6, and then selectively removed by using the known photolithographic technique to form a gate oxide film 15 and a gate electrode 16.

Subsequently, a P-type impurity, for instance, boron (B) is injected from the surface of the epitaxial layer 6 through ion implantation into a region for forming a P-type diffusion layer 11 by using the known photolithographic technique. After removing a photoresist, the impurity injected through ion implantation is diffused. In this step, one end of the gate electrode 16 is used, and the P-type diffusion layer 11 is formed in a self-aligning manner.

Figure 10:
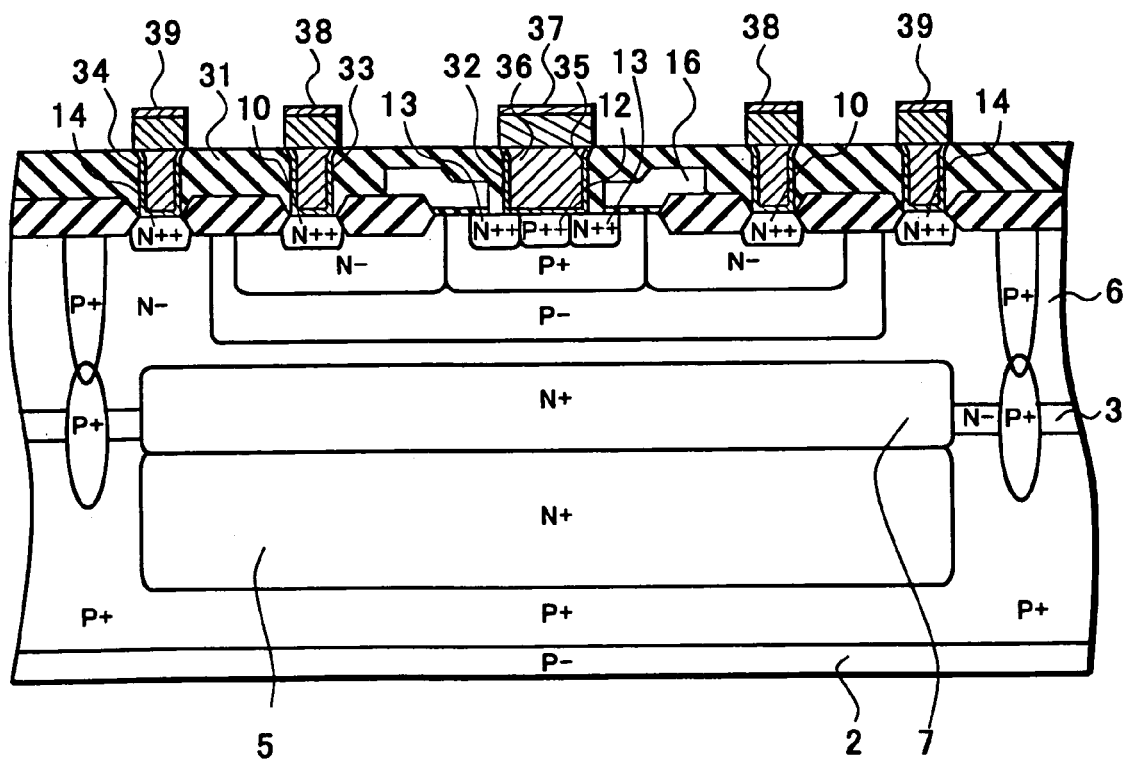
FIG. 10 is a sectional view illustrating the manufacturing method for the semiconductor device according to the embodiment of the present invention.

Finally, as shown in FIG. 10, an impurity is injected from the surface of the epitaxial layer 6 through the known photolithographic technique to form N-type diffusion layers 10, 13, and 14, and a P-type diffusion layer 12 sequentially. Following this, an insulating layer 31, for example, a BPSG film or an SOG film is formed on the epitaxial layer 6. Then, contact holes 32, 33, and 34 are formed through the insulating layer 31 with dry etching using a $CHF_3+O_2$ gas by using the known photolithographic technique.

Next, a barrier metal film 35 is formed on an inner wall of the contact holes 32, 33, and 34. After that, a tungsten (W) film 36 is filled in the contact holes 32, 33, and 34. Then, a copper aluminum (AlCu) film and a barrier metal film are formed on an upper surface of the tungsten (W) film 36 by a CVD method. Thereafter, the AlCu film and the barrier metal film are selectively removed through the known photolithographic technique to form a source electrode 37 and a drain electrode 38. Incidentally, although a wiring layer for the gate electrode 16 is omitted from the sectional view of FIG. 10, the wiring layer is connected in other regions. Although not shown, an electrode 39 formed on the N-type diffusion layer 14 is electrically connected so as to have a potential equal to that of the drain electrode 38.

As mentioned above, in this embodiment, the N-type buried diffusion layer 5 is formed to overlap with the P-type buried diffusion layer 4. An impurity concentration of the P-type buried diffusion layer 4 underlying the N-type buried diffusion layer 5 is kept high. According to the manufacturing method, a breakdown voltage of the PN junction region between the buried diffusion layers 4 and 5 can be easily adjusted to fall within a desired range.

In this embodiment, the N-type buried diffusion layer 7 is further formed on the N-type buried diffusion layer 5, and thus the buried diffusion layers 5 and 7 become continuous with each other. According to the manufacturing method, the continuous N-type buried diffusion layers 5 and 7 can be led out from the P-type buried diffusion layer 4.

Incidentally, this embodiment describes the example where the two N-type buried diffusion layers are continuous with each other and thus, the PN junction region that constitutes the overvoltage protection structure is formed. However, the embodiment of the present invention is not necessarily limited thereto. For example, a desired N-type buried diffusion layer may be formed through one or more diffusion steps. That is, an arbitrary design change can be made using any method capable of forming a PN junction region usable for the overvoltage protection structure. The embodiment of the present invention can be modified in various ways without departing from the sprit and scope of the invention.

According to the embodiment of the present invention, a PN junction region is formed by overlapping with a P-type buried diffusion layer and an N-type buried diffusion layer, below a region for forming any semiconductor element. A breakdown voltage of the PN junction region is set lower than a breakdown voltage of a PN junction region formed in a current path of the semiconductor element. This structure prevents the semiconductor element from being broken due to an overvoltage.

Further, according to the embodiment of the present invention, the PN junction region is formed over a wide area of an upper surface of the N-type buried diffusion layer. This structure distributes breakdown current at the PN junction region to prevent the PN junction region from being broken.

Further, according to the embodiment of the present invention, the N-type buried diffusion layer is formed below the element formation region to form the PN junction region. This structure enables an efficient arrangement of semiconductor elements in an actual operational region and miniaturization of a chip.

Further, according to the embodiment of the present invention, an overvoltage protection structure is realized using the PN junction region between the P-type buried diffusion layer and the N-type buried diffusion layer formed to overlap with the P-type buried diffusion layer. This structure makes it possible to keep a high impurity concentration of the P-type buried diffusion layer near the PN junction region and to set a breakdown voltage to a desired value.

What is claimed is:

1. A semiconductor device, comprising:
   a semiconductor substrate;
   a plurality of epitaxial layers deposited on the semiconductor substrate and used as a semiconductor element formation region;
   a buried diffusion layer of one conductivity type formed below the semiconductor element formation region; and
   a buried diffusion layer of an opposite conductivity type formed below the semiconductor element formation region and led out on the buried diffusion layer of the one conductivity type,
   wherein a breakdown voltage of a first junction region between the buried diffusion layer of the one conductivity type and the buried diffusion layer of the opposite conductivity type is lower than a breakdown voltage of a second junction region formed on a current path of a semiconductor element.

2. The semiconductor device according to claim 1, wherein the buried diffusion layer of the opposite conductivity type is formed by coupling a first buried diffusion layer of an opposite conductivity type formed to overlap with the buried diffusion layer of the one conductivity type with a second buried diffusion layer of an opposite conductivity type formed above the buried diffusion layer of the one conductivity type.

3. The semiconductor device according to claim 1 or 2, wherein the semiconductor element is any one of an NPN transistor, a PNP transistor, an N-channel MOS transistor, and a P-channel MOS transistor.

4. A semiconductor device, comprising:
a semiconductor substrate of one conductivity type;
a first epitaxial layer of an opposite conductivity type formed on the semiconductor substrate;
a buried diffusion layer of one conductivity type formed across the semiconductor substrate and the first epitaxial layer;
a first buried diffusion layer of an opposite conductivity type formed across the semiconductor substrate and the first epitaxial layer, the first buried diffusion layer being formed to overlap with the buried diffusion layer of the one conductivity type;
a first junction region between the buried diffusion layer of the one conductivity type and the first buried diffusion layer of the opposite conductivity type;
a second epitaxial layer of an opposite conductivity type formed on the first epitaxial layer;
a second buried diffusion layer of an opposite conductivity type formed across the first epitaxial layer and the second epitaxial layer so as to be continuous with the first buried diffusion layer of the opposite conductivity type; and
a semiconductor element formed above the second buried diffusion layer of the opposite conductivity type,
wherein a breakdown voltage of the first junction region is lower than a breakdown voltage of a second junction region formed on a current path of the semiconductor element.

5. The semiconductor device according to claim 4, wherein the first junction region is formed at and around a bottom of the first buried diffusion layer of the opposite conductivity type.

6. The semiconductor device according to claim 4 or 5, wherein the semiconductor element is any one of an NPN transistor, a PNP transistor, an N-channel MOS transistor, and a P-channel MOS transistor.

* * * * *